United States Patent
Feuerstein et al.

(10) Patent No.: US 9,789,513 B2
(45) Date of Patent: Oct. 17, 2017

(54) TOOLING FIXTURE ASSEMBLY FOR USE IN A COATING OPERATION

(71) Applicants: Albert Feuerstein, Carmel, IN (US); Andrew Thomas Westfall, Brownsburg, IN (US); Thomas F. Lewis, III, Zionsville, IN (US); David A. McPherson, Coatesville, IN (US); Ardy Kleyman, Carmel, IN (US); Don Lemen, Indianapolis, IN (US)

(72) Inventors: Albert Feuerstein, Carmel, IN (US); Andrew Thomas Westfall, Brownsburg, IN (US); Thomas F. Lewis, III, Zionsville, IN (US); David A. McPherson, Coatesville, IN (US); Ardy Kleyman, Carmel, IN (US); Don Lemen, Indianapolis, IN (US)

(73) Assignee: PRAXAIR S.T. TECHNOLOGY, INC., North Haven, CT (US)

( * ) Notice: Subject to any disclaimer, the term of this patent is extended or adjusted under 35 U.S.C. 154(b) by 494 days.

(21) Appl. No.: 13/707,901

(22) Filed: Dec. 7, 2012

(65) Prior Publication Data
US 2013/0149450 A1    Jun. 13, 2013

Related U.S. Application Data (60) Provisional application No. 61/568,353, filed on Dec. 8, 2011.

(51) Int. Cl.
*B05C 13/02* (2006.01)
*C23C 14/04* (2006.01)
*C23C 14/50* (2006.01)

(52) U.S. Cl.
CPC ............ *B05C 13/02* (2013.01); *C23C 14/042* (2013.01); *C23C 14/505* (2013.01)

(58) Field of Classification Search
None
See application file for complete search history.

(56) References Cited

U.S. PATENT DOCUMENTS 3,765,667 A * 10/1973 Christiansen .................. 269/59
5,486,281 A *  1/1996 Gruver et al. ................ 205/110
(Continued)

FOREIGN PATENT DOCUMENTS

EP          0953656 A2   11/1999
EP          2014377 A1    1/2009
WO   WO 2007/008972 A1   1/2007

OTHER PUBLICATIONS

Esser, WO 2009/149864, Dec. 17, 2009.*

*Primary Examiner* — Charles Capozzi
(74) *Attorney, Agent, or Firm* — Nilay S. Dalal (57) ABSTRACT

A modular, rotisserie type tooling fixture assembly for use in a coating operation and method of its use are disclosed. The tooling fixture assembly includes an arbor or shaft and a retaining base with a plurality of anchor members disposed in a prescribed radial orientation from the center of the retaining base, the anchor members are uniquely configured or adapted to retain a plurality of workpieces to be coated. The tooling fixture assembly further comprises a unique workpiece masking arrangement that employs a unitary masking cap having a plurality of solid walls or surfaces adapted to cover portions of the plurality of workpieces in a masking relationship.

22 Claims, 9 Drawing Sheets

(56) References Cited

U.S. PATENT DOCUMENTS

| | | | |
|---|---|---|---|
| 5,803,971 A | | 9/1998 | Menchetti et al. |
| 5,902,471 A | * | 5/1999 | Jordan et al. ................. 205/122 |
| 5,997,947 A | | 12/1999 | Burns et al. |
| 7,837,843 B2 | | 11/2010 | Sharp et al. |
| 8,323,409 B2 | | 12/2012 | Schlichting et al. |

* cited by examiner

TOOLING FIXTURE ASSEMBLY FOR USE IN A COATING OPERATION

The present application claims priority from U.S. Application Ser. No. 61/568,353, filed Dec. 8, 2011, which is incorporated by reference herein in its entirety.

FIELD OF THE INVENTION

This invention relates to a tooling fixture assembly for use in a physical vapor deposition coating operation and more particularly, to a tooling fixture assembly and method for simultaneously coating a plurality of workpieces, such as gas turbine high pressure turbine blades and vanes, with thermal barrier or environmental barrier coatings.

BACKGROUND

Physical vapor deposition is extensively used to apply ceramic thermal barrier coatings on turbine airfoils by electron beam evaporation. Extensive work has been done to design coating processes and associated fixturing to apply a uniform coating on a variety of airfoil sizes and shapes. Physical vapor deposition is a line of sight coating process. Substrates to be coated need to be manipulated in the vapor to achieve uniform coverage. Sections of the substrate that do not require a coating need to be masked adequately.

U.S. Pat. No. 5,997,947 discloses a modular, rotisserie type coating fixture for use in electronic beam physical vapor deposition (EBPVD) coating processes. Tooling fixtures used in the EBPVD coating process generally include a support structure and means to couple the support structure and allow it to be rotated about a first axis. The tooling fixture further includes a cassette means within the support structure for holding one or more workpieces to be coated in place. The cassette means are joined to the support structure by spindles which allow the cassette means to rotate about a second axis substantially parallel to the first axis and thereby allow each workpiece being coated to rotate about its longitudinal axis. The cassette means support each workpiece so that surfaces of the airfoil to be coated are maintained substantially parallel to the coating source. However, loading of the workpieces within each of the cassettes can be time consuming. Furthermore, the cage-like structures of the cassettes involve complicated construction.

U.S. Pat. No. 7,837,843 discloses a rotisserie type tooling fixture assembly for use in a physical vapor deposition coating operation which comprises a cylindrical type support structure comprising a circular base member, a circular top member opposite the circular base member, and a plurality of structural members joining the top member to said base member. The workpieces are arranged in a plurality of panel members aligned in a staggered vertical direction around the outer periphery of said support structure forming the cylinder-like structure. While this tooling fixture orients the workpieces to improve the throughput of workpieces to be coated, there is no resolution of the issues and problems associated with workpiece masking.

While most prior art tooling fixtures all hold multiple workpieces or airfoils at optimum angles, there continues to be a need in the art for coating fixtures for use in a physical vapor deposition coating operation which allow for improved loading of workpieces and masking operations which promote and advance the production of high quality coatings. What is needed therefore is improved tooling and fixtures for coating operations that improve the workpiece loading and masking operations. Further, such improved coating fixtures and tooling should be reusable and relatively inexpensive to fabricate.

SUMMARY OF THE INVENTION

This invention relates to a modular, rotisserie type tooling fixture assembly for use in a coating operation comprising: a retaining base defining a central aperture through which a shaft extends, and a plurality of anchor members disposed in a prescribed radial orientation from the central aperture, the anchor members configured or adapted to load and retain a plurality of workpieces to be coated; and a unitary masking cap structure having a central aperture through which the arbor or shaft selectively is guided therethrough so as to align and engage the masking cap structure with the retaining base, the masking cap structure having a top portion and a bottom portion adapted to cover portions of the plurality of workpieces in a masking relationship.

This invention also relates to a method for coating a plurality of workpieces comprising: loading a plurality of workpieces into anchor members disposed in a prescribed radial orientation from a central aperture on a retaining base, the anchor members configured to retain the plurality of workpieces to be coated; placing the retaining base on an arbor or shaft; placing a unitary masking cap having a central aperture through which the arbor or shaft is selectively guided therethrough to be disposed in engagement and alignment with the retaining base, the masking cap having a plurality of solid walls or surfaces adapted to cover portions of the plurality of workpieces in a masking relationship while leaving exposed surfaces on the plurality of workpieces; locking the retaining base and the unitary masking cap together to form a tooling fixture assembly; mounting the tooling fixture assembly with workpieces disposed therein into a coating device adapted to coat exposed surfaces of the plurality of workpieces within the coating device; and rotating the tooling fixture assembly within the coating device via the arbor or shaft until a desired coating has been formed on any exposed surfaces of the plurality of workpieces.

BRIEF DESCRIPTION OF THE DRAWINGS

The above and other aspects, features, and advantages of the present invention will be more apparent from the following, more detailed description thereof, presented in conjunction with the following drawings, wherein.

DETAILED DESCRIPTION

Figure 1:
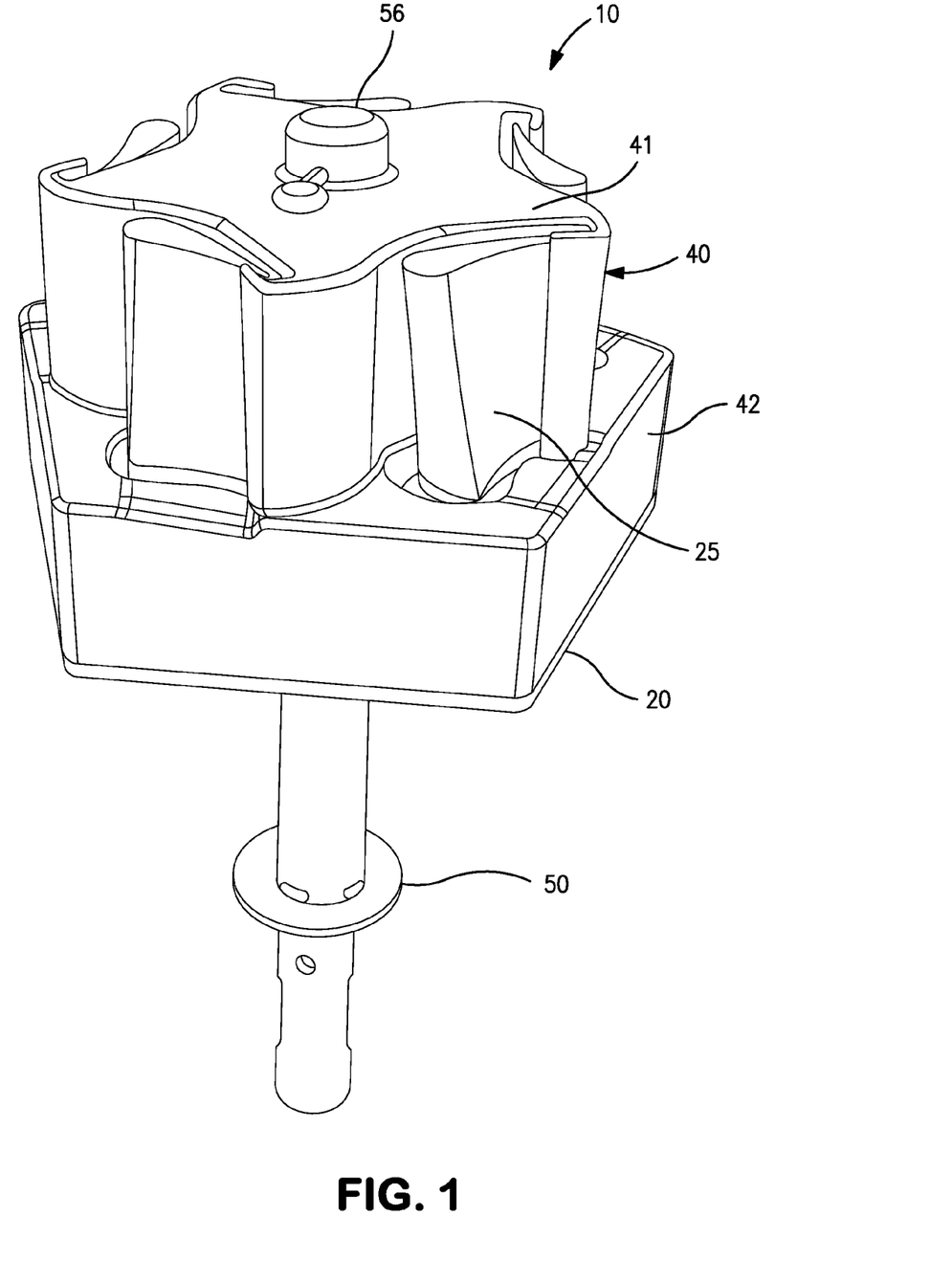
FIG. 1 is a perspective view of an embodiment of the tooling fixture assembly showing a plurality of workpieces to be coated secured thereto.

FIG. 1 show a tooling fixture 10 in accordance with the principles of the present invention. The tooling fixture includes a retaining base 20, a unitary masking cap structure 40 and an arbor or shaft 50 extending along a central axis of the fixture 10. Workpieces 25 are shown loaded onto the retaining base 20. The workpieces 25 to be coated can be any type of workpiece requiring coating, including gas turbine high pressure turbine blades and vanes. In a preferred embodiment, the workpieces 25 are airfoil blades. The term "workpiece", "part" and "airfoil blade" will be used interchangeably herein for purposes of describing the various embodiments of the present invention.

The masking cap structure 40 is lowered onto the retaining base 20 to create the loaded configuration of the tooling fixture 10. The masking cap structure 40 is designed to selectively conceal surfaces of the workpieces 25 to ensure that coating is only applied onto exposed surfaces of the workpieces 25. The masking cap structure 40 therefore masks all portions of the workpieces 25 that are not to be coated. In this manner, the masking cap structure 40 can provide precision masking of the workpieces 25 with minimum overspray to produce coated workpieces 25 having desired dimensional tolerances.

The masking cap 40 is a unitary structure that is designed to slide over the plurality of workpieces 25 and the retaining base 20. The masking cap structure 40 shown in FIG. 1 includes a top portion 41 and a bottom portion 42. The top portion 41 contains a plurality of solid walls having contoured surfaces which conform to the curvature of the convex backsides of each of the workpieces 25. The contoured surfaces abut against the backsides of the workpieces 25 to adequately mask the backsides during a coating operation that are not to be coated. The bottom portion 42 is a housing structure that contains corresponding openings that expose portions of the workpieces 25 to be coated. The embodiment of FIG. 1 shows that the bottom portion 42 is sized to mask the platform and root regions of the workpieces 25.

FIG. 1 shows that the solid walls or surfaces of the top portion 41 of unitary mask structure 40 are configured to conform to the shape of and generally abut most of the surfaces of the airfoil blade 25 that are not to be coated including, for example, the trailing edge as well as portions of the platform and convex backside of the airfoil blades while exposing the portions or concave surfaces of the airfoil blades 25 to be coated.

Figure 2:
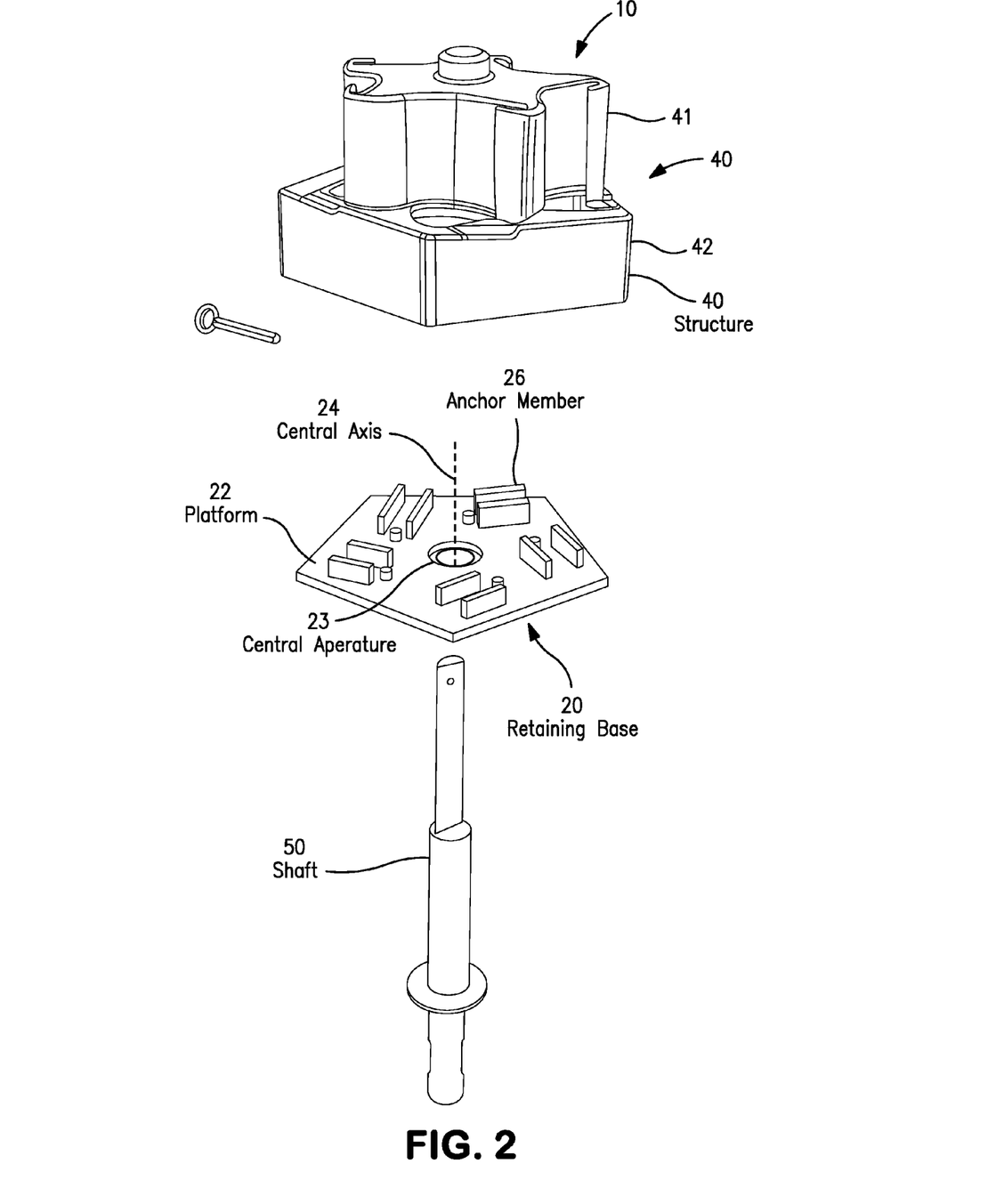
FIG. 2 is an exploded view of the tooling fixture assembly of the present invention.

FIG. 2 shows an exploded view of the tooling fixture 10 prior to assembly of the components and loading of the workpieces 25. The retaining base 20 includes a platform 22 having a central aperture 23 and defining a central axis 24 orthogonal to the plane of the platform 22. The platform 22 is shown to have the same shape as the cap mask structure 40, thereby enabling the structure 40 and platform 22 to fixedly engage with each other when assembled, as shown in FIG. 1.

Figure 3:
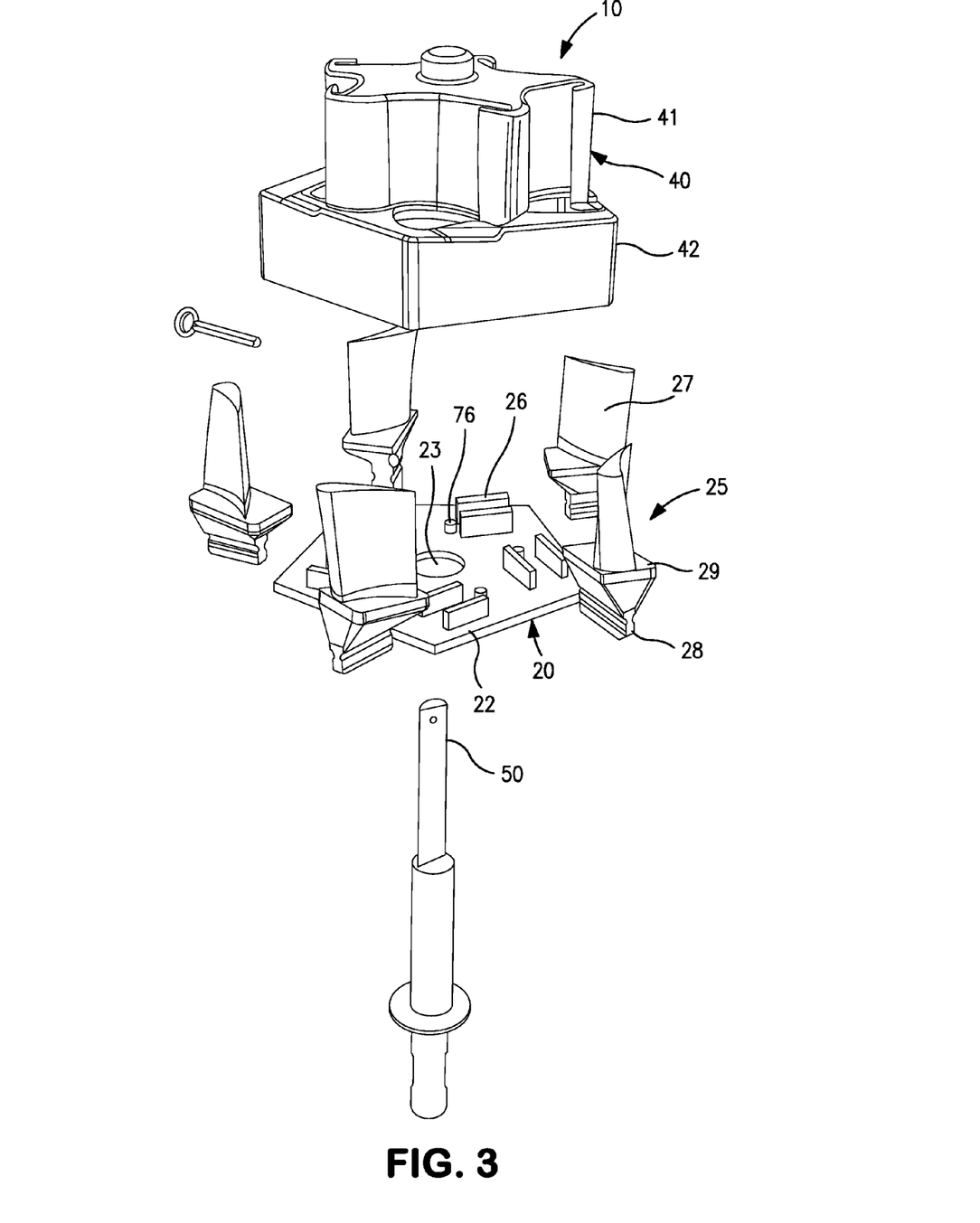
FIG. 3 is an exploded view of the tooling fixture assembly of FIG. 2 including arrangement of the workpieces to be coated.
Figure 4:
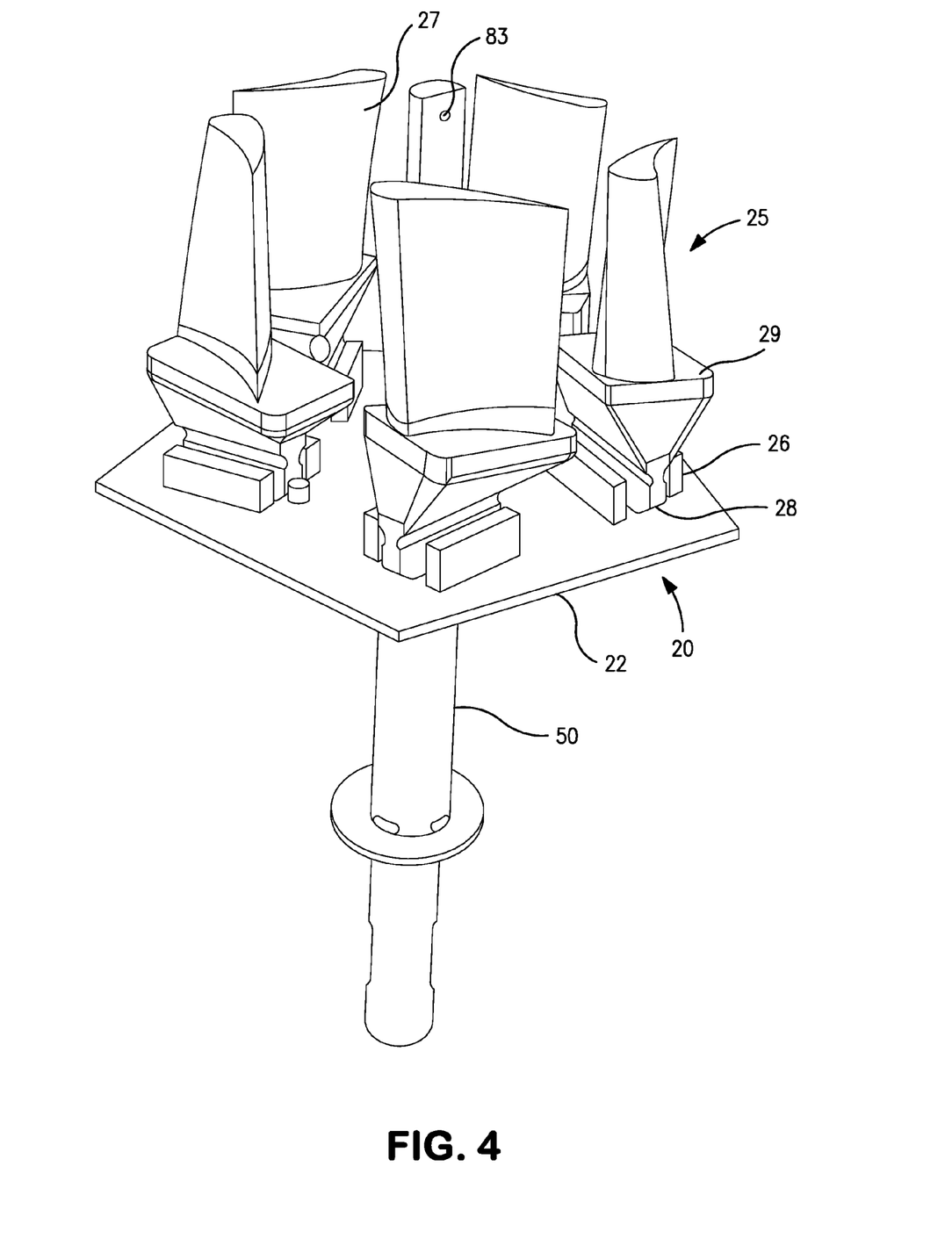
FIG. 4 is a perspective view of an embodiment of the tooling fixture assembly showing the retaining base, workpieces secured thereto and the shaft extending through a central aperture of the retaining base.

The retaining base 20 also includes a plurality of anchor members 26 or chuck structures rising from the surface of the platform 22 and disposed in a prescribed radial orientation from the central axis 24. Each of the anchor members 26 or chuck structures is configured or adapted to hold a workpiece 25 to be coated. FIG. 2 shows that each of the anchor members 26 contains a pair of rail-like structures into which a dovetail portion of a workpiece 25 can be slidably loaded therein. Specifically, the rail-like structure contains protrusions which engage with grooves contained along the dovetail section 28 of the workpieces 25, as can be more clearly seen in FIG. 3. The arrow shown in FIG. 3 indicates that the dovetail section 28 of the workpiece 25 is to be slidably loaded into the rail-like structures of an anchor member 26. As workpiece 25 is urged or pushed into the anchor member 26, the pair of rail-like structures engage with each side of the dovetail section 28. The workpiece 25 continues to slidably load within anchor member 26 until abutting against a positioning stop feature 76 located at the back side of each of the anchor members 26. The positioning stop feature 76 (FIG. 3) located on the back side of each of the anchor members 26 limits how far the dovetail section 28 of the workpiece 25 can slidably load within the rail-like structures. FIG. 4 shows all of the workpieces 25 loaded into their respective anchor members 26. The anchor members 26 are aligned with corresponding openings of the bottom portion 42 of the masking cap structure 40. Accordingly, when the masking cap structure 40 is lowered onto the loaded retaining base 20, the workpieces 25 will be oriented as required for the coating operation, as shown in FIG. 1. In particular, the platform 29 and dovetail section 28 will be masked by bottom portion 42 of the masking cap structure 40, and the convex backside portion 27 of the workpiece 25 will be masked by top portion 41 of masking cap structure 40. In this manner, the anchor members 26 and their corresponding positioning stop features 76 can ensure that the loaded workpieces 25 are adequately loaded and positioned within tooling fixture 10 during a coating operation.

In the illustrated and preferred embodiments, the anchor members 26 or chuck structures are disposed in a radial orientation around the central axis 24. Each anchor member 26 or chuck structure is specifically configured to receive the root section 28 of an airfoil workpiece 25. As a result, the workpieces 26 are also radially oriented about the central axis 24. The radial orientation of the workpieces 25 creates a configuration that optimizes the coating coverage of the workpieces 25. It should be understood that modification to the design of the retaining members 26 and other components of the fixture 10 can enable greater or less than five workpieces 25 to be loaded onto the base 20, and that such modification is within the scope of the present invention.

In a preferred embodiment, the pentagonal configuration of the masking cap structure 40 is designed to orient the trailing edges of the workpieces 25 in close proximity to the edge or periphery of the cap structure 40, thereby potentially requiring the coating to travel a reduced distance to the exposed coating surface of the workpiece 25. In this manner, there may be a greater likelihood of coating depositing onto the intended exposed surface of the airfoil workpiece 25 rather than undesirably adhering to the surfaces of the mask cap structure 40. Although a pentagonal geometry is preferred, it should be understood that other shapes for the mask cap structure 40 can be employed.

Figure 5:
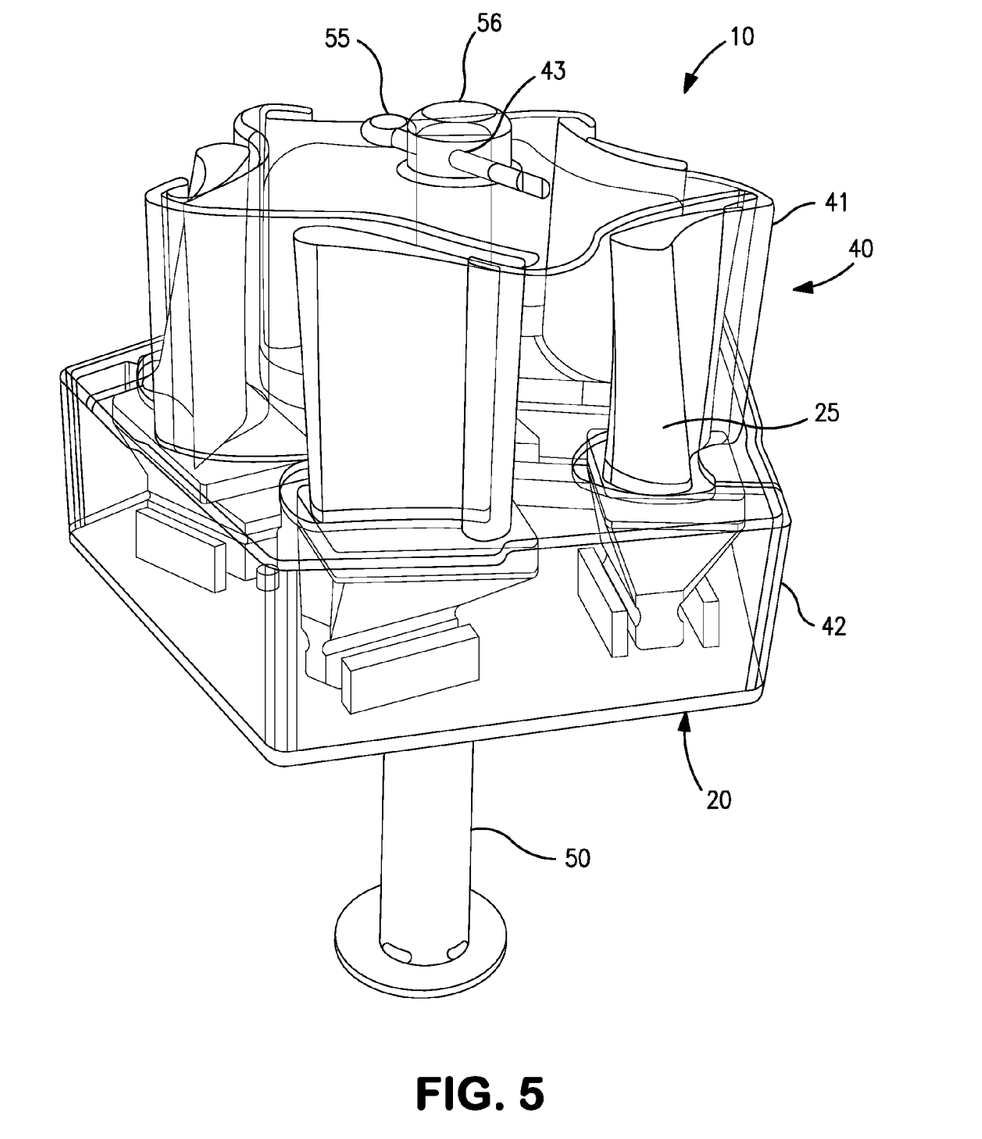
FIG. 5 is a perspective view of the tooling fixture assembly in accordance with the present invention, including engagement of the top of the shaft to a unitary masking cap structure.
Figure 6:
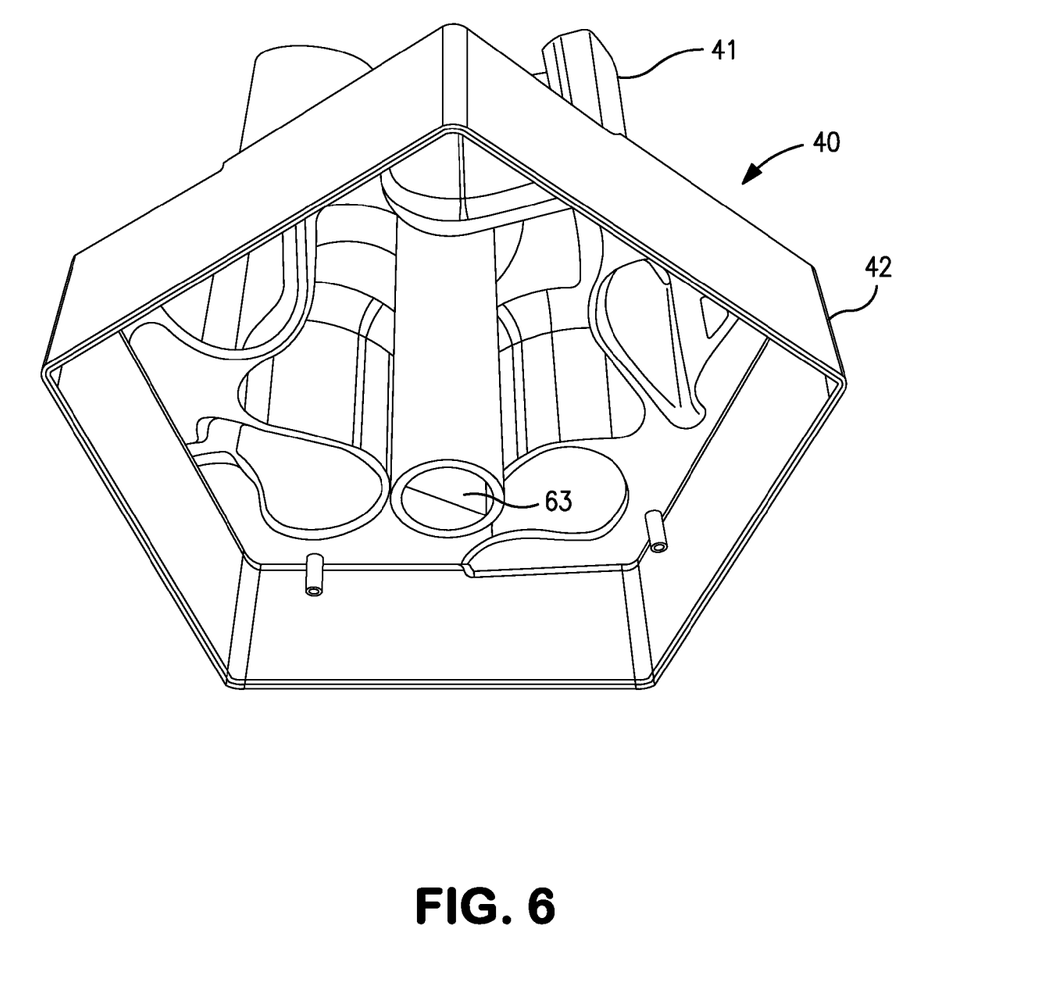
FIG. 6 is a perspective view of an embodiment of the tooling fixture assembly showing a unitary masking cap having an engagement member extending along the central axis of the cap for guiding the cap along a shaft and onto the retaining base.

Referring to FIG. 5, proximate the top of the unitary masking structure of the masking cap 40 is a center alignment hole or aperture 43 through which the arbor or shaft 50 extends. For purposes of clarity, a portion of the bottom portion 42 of the cap 40 is shown to be transparent to show engagement of the anchor members 26 with the dovetail 28 section of the workpieces 25. FIG. 6 shows that the masking cap 40 contains a half-rounded feature 63 extending along the central axis of the cap 40. The feature 63 is adapted to engage with a corresponding half-rounded portion of shaft 50 shown in FIG. 4. In this manner, the masking cap 40 can be oriented and maintained in a substantially vertical configuration as it is lowered onto the platform 22 of retaining base 20. As a result, the cap structure 40 can be selectively guided in a controlled manner onto the half-rounded portion of the shaft 50 (or vice versa) as shown in FIG. 4 so that it does not inadvertently make contact with the workpieces 25. Selective guiding of the cap 40 and shaft 50 allows the cap 40 to be lowered onto the platform 22 so that it is aligned with retaining base 20. When the cap structure 40 is lowered down onto the retaining base 20, the openings of the bottom portion 42 of the cap 40 receive the workpieces 25, thereby aligning the masking cap 40 with the workpieces 25 loaded onto the retaining base 20 (FIG. 4). It should be understood that other structures as known in the art can be employed to achieve selective engagement of the masking cap 40 with the shaft 50 to enable alignment of the cap 40 onto the base 20.

As indicated above, the masking cap 40 slides over the plurality of loaded workpieces 25 and the retaining base 20 using the arbor or shaft 50 as a guide for alignment of the workpieces 25. As the masking cap 40 is lowered onto the retaining base 20, the unitary mask structure 40 physically engages and fixedly retains the workpieces 25 in the anchor members 26 or chuck structures on the retaining base 20 to form the tooling fixture assembly 10. Referring to FIG. 5, an auxiliary retention means such as cotter pin 55 or the like can be used to lock the arbor or shaft 50 at a location above the top of the unitary masking structure 40 to lock the tooling fixture assembly 10 in place and ensure the entire tooling fixture assembly 10 and loaded workpieces 25 therein rotate as a single unit or assembly as the arbor or shaft 50 is rotated during the coating process.

Still referring to FIG. 5, the top or distal section of the shaft 50 is preferably covered by a knob-like structure 56 disposed over the masking cap 40. The knob-like structure 56 prevents exposure of the distal section of the shaft 50 to buildup of coating during a coating operation. Eliminating coating buildup along the shaft and cotter pin 55 eliminates difficulties in removing the masking cap 40 from the shaft 50 as a result of the diameter of the shaft 50 undesirably increasing due to build up of coating. Accordingly, the knob-like structure 56 facilitates engagement and disengagement of the masking cap 40 from the shaft 50 and cotter pin 55.

The arbor or shaft 50 is comprised of several sections including a distal section, a middle section, and a proximate or lower section. FIGS. 4 and 5 show that the distal section of the arbor or shaft 50 has a hole 83 through which the cotter pin 55 is inserted to lock together the various components of the tooling fixture assembly 10. As previously described in relation to the embodiments of FIGS. 4 and 6, the shaft diameter at or near the distal section 52 can be a half-round structure that is selected to operatively engage a corresponding half-round structure of the masking cap 40. FIG. 4 further shows that the middle section of the shaft 50 has a shaft diameter larger than the shaft diameter of the distal section and is sized to operatively engage the retaining base 20 and secure it in the prescribed position along the arbor or shaft 50. The middle section of the shaft 50 can be tack welded to the retaining base 20 along the central aperture 23. The lower section of the shaft 50 is sized to be mounted in and engage with the rotating drive of a coating device.

In operation of the illustrated embodiment, five workpieces 25 or airfoils are loaded into the anchor members 26 or chuck structures. As explained in relation to FIGS. 2-4, the workpieces 25 or airfoils are each loaded by inserting or sliding the root section 28 of the airfoil into the correspondingly shaped anchor member or anchoring location extending in an upward orientation from the retaining base 20. A pair of rail-like structures of the anchor members 26 engages with corresponding grooves contained along the dovetail 28 sections of the airfoils 25. The airfoil 25 slidably loads into the anchor member 26 until abutting a positioning stop feature 76. After loading each of the five airfoils 25 in this manner, the arbor or shaft 50 is then inserted through apertures of the retaining base 20.

The masking cap 40 is then aligned with the airfoils 25 and coaxially slid down the arbor or shaft 50 and over the upwardly extending airfoils 25 and the retaining base 20. The masking cap 40 selectively engages with the shaft 50 to enable controlled and selective alignment of the cap 40 onto the base 20. In such position, the upper portion or unitary mask structure 40 engages or covers portions of the airfoils or workpieces 25 to be masked and leaves exposed those surfaces of the workpieces 25 or airfoils to be coated. The cotter pin 55 is then inserted through a hole 83 in the distal section of the arbor or shaft 50 above the masking cap structure 40 to lock the tooling fixture assembly 10 around the workpieces 25.

The tooling fixture assembly 10 is then ready to be loaded or mounted into the coating equipment (e.g. EBPVD equipment) proximate the source of coating material in preparation for coating of the exposed surfaces of the airfoils. During the coating process, the arbor or shaft 50 of the tooling fixture assembly is rotated about the central axis. Rotation of the tooling fixture assembly 10 within the coating equipment continues until a desired coating has been formed on those exposed surfaces of the workpieces 25 or airfoils in a line of sight with the coating material.

This presently illustrated tooling fixture assembly 10 uses the one piece retaining base 20 to load multiple parts or workpieces 25 in the anchor members 26 in a simple and rapid fashion thereby significantly reducing the labor and labor costs associated with loading and securing the multiple workpieces within the tooling fixture. Of particular advantage with the present tooling fixture assembly 10 is that there are little or no moving parts such as hinges, clasps, springs, etc. or assembly accessories such as wires that are commonly found in conventional tooling fixtures for rotor blades, stator vanes, airfoils etc.

A further improvement of the new fixture assembly 10 is the reduction of the ratio of thermal mass of the fixture assembly 10 relative to the thermal mass of the workpieces to be coated. The net result can be a shorter heat up time which can translate into increased productivity. Typically, the workpieces are pre-heated in vacuum before coating. The pre-heating occurs in a pre-heater, which uses radiant heating elements to heat the workpieces to be coated to a temperature of about 1900° F. to 2000° F. The time required to bring the workpieces to this elevated temperature is generally dependent upon the surface area of the fixture assembly 10, which is exposed to the heating elements of the pre-heater. Even more so, the required heating time can be significantly dependent upon the thermal mass of the workpieces. Consequently, conventional fixture-part assemblies require significant pre-heat time to attain the required elevated temperature. By way of illustration, conventional fixture-part assemblies can typically have a thermal mass ratio of fixture to workpiece of about 2.0. The present invention offers a unique design for an optimized fixture assembly that reduces the thermal mass ratio to a factor of 1.5 or lower, thereby accelerating the pre-heat time for the complete part—fixture assembly. This is a significant design and process improvement that results in productivity enhancements which can shorten the pre-heat time of the workpieces by approximately 10% to 15%.

In addition, the present embodiments allow simultaneous or concurrent masking of the multiple workpieces through the use of the one piece masking cap structure 40. In other words, the masking cap structure 40 beneficially allows the masking of a plurality of workpieces 25 in a fraction of the time required with conventional tooling fixtures. While the size of the coating equipment often dictates the maximum size of the tooling fixtures, the illustrated embodiments provide the ability to coat up to five airfoil blades per tooling fixture whereas the prior art tooling assembly for similar blades was limited to only four airfoil blades per tooling. This increased capacity is directly attributed to the design of the retaining base 20 that elegantly secures the plurality of workpieces 25 with optimized spacing between workpieces 25 and sans any hinged elements, wires, clasps, etc. The increased capacity is also a result of the custom designed unitary masking elements of the illustrated embodiments, which makes the illustrated tooling fixture assembly 10 an easy to assemble apparatus and ergonomical design which eliminates potential repetitive stress injuries, maximizes single piece flow potential, etc.

Another advantage is that the illustrated tooling fixture assembly 10 is preferably secured with a single cotter pin 55 inserted through the arbor or shaft 50 above the primary masking cap 40 and eliminates the multiple hinges, pins and wires of prior art tooling fixture designs. This lack of intricate or moving parts in the tooling assembly 10 of the present invention not only facilitates the loading, aligning, securing and masking of workpieces 25 in the tooling fixture assembly but also facilitates the rapid disassembly and workpiece removal processes. Also, because of the simplicity and lack of moving parts along with the specific unitary mask structure, the individual components of the illustrated tooling assembly 10 are much easier to clean and strip after the coating process compared to the prior art tooling assemblies which, in turn reduces the overall process steps and associated labor costs as well as eliminating sources of contamination in the overall coating processes.

In addition, the single mask for multiple workpieces is easier to examine and inspect during the coating process which, in turn, improves coating process quality and part rejection due to loading and masking errors. Finally, the present embodiments of the tooling fixture assembly allows for a rigid design with a minimum thermal mass that securely fixates the parts or workpieces thereby minimizing part movement during the coating operation that could compromise or adversely affect the coating quality.

The presently disclosed embodiments of the tooling fixture assembly and components thereof are preferably formed from a casting process. As cast-able components, there are no welds in the tooling fixture assembly. Eliminating the welds in the fabrication process reduces the number and magnitude of cracks and crevices in the assembly that can lead to failure or potentially trap contaminates.

Another feature of the presently disclosed embodiments of the tooling fixture assembly is that the assembly is a relatively simple, inexpensive, modular, rotisserie type coating fixture that locates and fixates the parts or workpieces with a high degree of precision reducing overcoating errors. The tooling fixture assembly described herein has particular utility in the coating of turbine engine airfoils as it improves the overall cost associated with the coating process as well as improving the workpiece quality and coating process yield compared to prior art tooling fixture assemblies.

Figure 7:
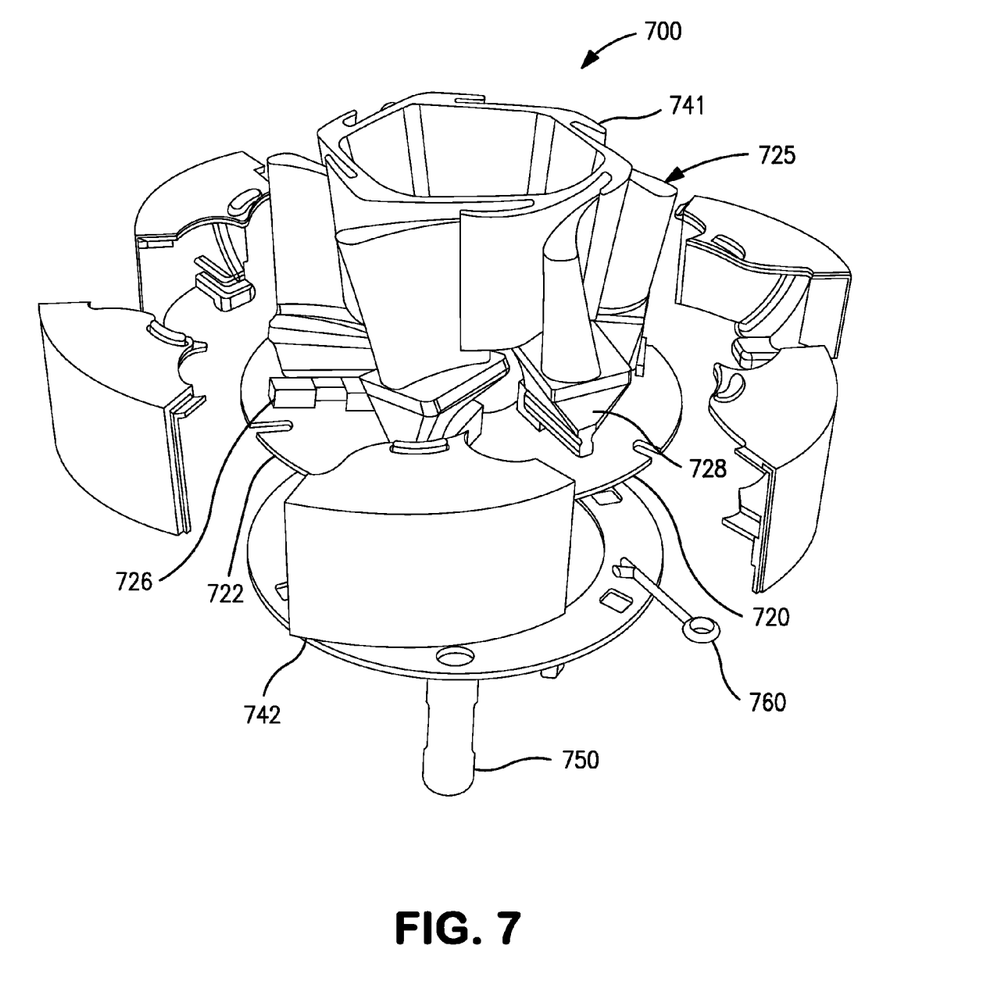
FIG. 7 is an exploded view of the tooling fixture assembly in accordance with another embodiment of the present invention.
Figure 8:
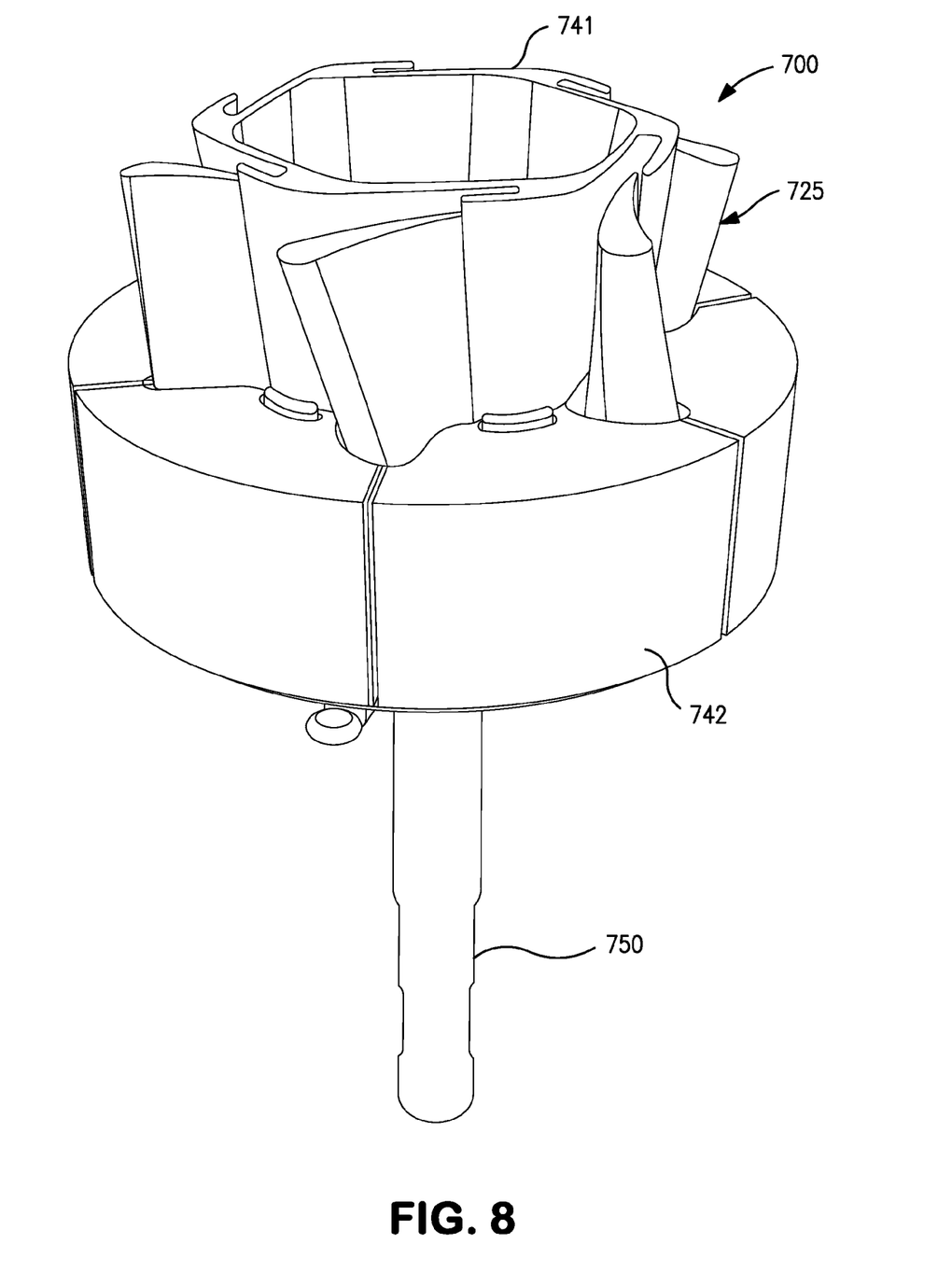
FIG. 8 is a perspective view of the tooling fixture assembly of FIG. 7 including arrangement of workpieces to be coated.
Figure 9:
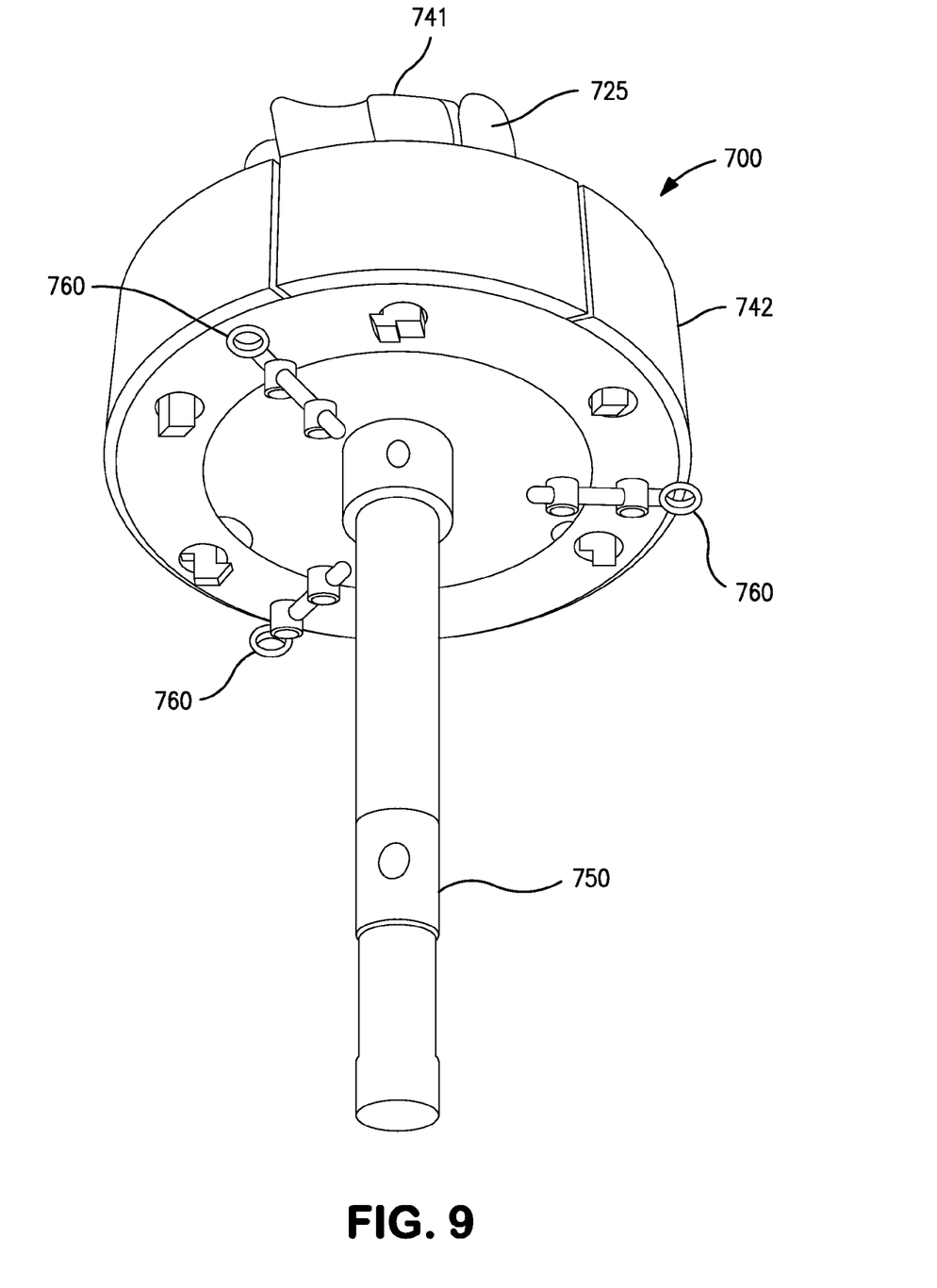
FIG. 9 is another perspective view of the tooling fixture assembly of FIG. 7 showing the locking arrangement.

Another embodiment of the tooling fixture assembly is shown in FIGS. 7 through 9. As seen therein, this embodiment of the tooling fixture assembly 700 comprises a unitary upper masking structure 741, a multi piece lower masking structure 742, a retaining base 720; and an arbor or shaft 750.

As with the earlier described embodiments, the retaining base 720 includes a platform having a central aperture and defining a central axis orthogonal to the plane of the platform 722. The retaining base 720 also includes a plurality of anchor members 726 rising from the surface of the platform 722 and disposed in a prescribed radial orientation from the central axis. Each anchor member 726 is configured or adapted to hold a workpiece 725 to be coated. In the illustrated embodiments, there are six anchor members 725 disposed radially around the central axis. Each anchor member 726 is specifically configured to receive the uniquely designed root section of an airfoil or workpiece 725.

The multi piece lower masking structure 742 is comprised of multiple interlocking sections with each section configured to physically restrain one or more workpieces 725 in a fixed orientation as well as mask selected portions of the workpieces 725. When fully assembled, the multi piece lower masking structure 742 forms a shroud around the lower or root section 728 of the plurality of workpieces 725. FIG. 9 shows that the multiple sections of the multi piece lower masking structure 742 are preferably held together with a plurality of locking rings 760 disposed in operative engagement on the underside of the masking assembly 700 and retaining base.

The embodiment illustrated in FIGS. 7 through 9 also includes a unitary upper masking structure 741. The unitary upper masking structure 741 is coupled to the arbor 50 and otherwise supported by the retaining base 720. The unitary upper masking structure 741 is designed to engage the plurality of workpieces 725 such that the solid surfaces of the unitary upper masking structure 741 abut selected areas of the workpieces 725 to mask those areas of the workpieces 725 that are not to be coated and leaving the areas of the workpieces 725 to be coated exposed.

From the foregoing, it should be appreciated that the present invention thus provides a tooling fixture assembly for use in coating operations. While the invention herein disclosed has been described by means of specific embodiments and processes associated therewith, numerous modifications and variations can be made thereto by those skilled in the art without departing from the scope of the invention as set forth in the claims or sacrificing all of its features and advantages.

The invention claimed is:

1. A modular, rotisserie-tooling fixture assembly for use in a coating operation comprising:
    a single retaining base with a single platform defining a first central aperture through which a shaft extends, and a plurality of anchor members disposed in a prescribed radial orientation from the central aperture; and a unitary masking cap structure having a second central aperture through which the shaft selectively is guided therethrough so as to align and engage the masking cap structure with the single retaining base, the masking cap structure having a top portion and a bottom portion adapted to cover portions of a plurality of workpieces in a masking relationship, wherein the bottom portion of the cap structure is a housing structure that contains corresponding openings that expose portions of the workpieces to be coated;

wherein said workpieces are configured to rotate during the coating operation about a central axis of the rotisserie tooling fixture assembly, wherein said workpieces remain rotationally fixed relative to the anchor members, and said anchor members remain rotationally fixed relative to the single retaining base.

2. The tooling fixture assembly of claim 1, wherein the anchor members comprise a positioning stop feature.

3. The tooling fixture assembly of claim 1, wherein the top portion of the cap structure comprise a plurality of solid surfaces characterized by contoured surfaces conforming to the curvature of backsides of each of the workpieces.

4. The tooling fixture assembly of claim 1, wherein each of the plurality of anchor members comprise a pair of rail structures including protrusions, the protrusions configured to engage with corresponding grooves contained along a dovetail section of an airfoil workpiece.

5. The tooling fixture assembly of claim 1, wherein the bottom portion of the cap structure is pentagon-shaped.

6. The tooling fixture assembly of claim 1, wherein the tooling fixture is configured to receive at least 5 airfoil workpieces.

7. The tooling fixture assembly of claim 1, wherein a top or distal section of the shaft is covered by a knob structure disposed over the masking cap structure.

8. The tooling fixture assembly of claim 1, wherein the tooling fixture assembly is characterized by a ratio of thermal mass of the fixture assembly to thermal mass of the workpieces to be coated.

9. The tooling fixture assembly of claim 1, wherein a distal section of the shaft is secured to the cap structure to lock the tooling fixture assembly around the plurality of workpieces.

10. The tooling fixture assembly of claim 1, wherein each of the plurality of anchor members are disposed on the single platform of the single retaining base at a position that coincides with an opening contained within the bottom portion of the unitary masking cap structure.

11. The tooling fixture assembly of claim 1, further comprising a locking mechanism to keep components of the tooling fixture assembly and the workpieces retained therein coupled together.

12. A modular, rotisserie-tooling fixture assembly for use in a coating operation comprising:

a single retaining base with a single platform defining a first central aperture through which a shaft extends, and a plurality of anchor members disposed in a prescribed radial orientation from the central aperture; and a unitary masking cap structure having a second central aperture through which the shaft selectively is guided therethrough so as to align and engage the masking cap structure with the single retaining base, the masking cap structure having a top portion and a bottom portion adapted to cover portions of a plurality of workpieces in a masking relationship, wherein the bottom portion of the cap structure is configured to mask the single platform and root regions of a plurality of airfoil workpieces;

wherein said workpieces are configured to rotate during the coating operation about a central axis of the rotisserie tooling fixture assembly, wherein said workpieces remain rotationally fixed relative to the anchor members, and said anchor members remain rotationally fixed relative to the single retaining base.

13. The tooling fixture assembly of claim 12, wherein the anchor members comprise a positioning stop feature.

14. The tooling fixture assembly of claim 12, wherein the top portion of the cap structure comprise a plurality of solid surfaces characterized by contoured surfaces conforming to the curvature of backsides of each of the workpieces.

15. The tooling fixture assembly of claim 12, wherein each of the plurality of anchor members comprise a pair of rail structures including protrusions, the protrusions configured to engage with corresponding grooves contained along a dovetail section of an airfoil workpiece.

16. The tooling fixture assembly of claim 12, wherein the bottom portion of the cap structure is pentagon-shaped.

17. The tooling fixture assembly of claim 12, wherein the tooling fixture is configured to receive at least 5 airfoil workpieces.

18. The tooling fixture assembly of claim 12, wherein a top or distal section of the shaft is covered by a knob structure disposed over the masking cap structure.

19. The tooling fixture assembly of claim 12, wherein the tooling fixture assembly is characterized by a ratio of thermal mass of the fixture assembly to thermal mass of the workpieces to be coated.

20. The tooling fixture assembly of claim 12, wherein a distal section of the shaft is secured to the cap structure to lock the tooling fixture assembly around the plurality of workpieces.

21. The tooling fixture assembly of claim 12, wherein each of the plurality of anchor members are disposed on the single platform of the single retaining base at a position that coincides with an opening contained within the bottom portion of the unitary masking cap structure.

22. The tooling fixture assembly of claim 12, further comprising a locking mechanism to keep components of the tooling fixture assembly and the workpieces retained therein coupled together.

* * * * *